United States Patent [19]
Kuisma

[11] Patent Number: 5,123,031
[45] Date of Patent: Jun. 16, 1992

[54] CONTROL VOLTAGE GENERATOR IN A TRANSMITTER ARRANGEMENT FOR DIGITALLY MODULATED SIGNALS

[75] Inventor: Erkki Kuisma, Salo, Finland
[73] Assignee: Nokia-Mobira Oy, Salo, Finland
[21] Appl. No.: 308,247
[22] Filed: Feb. 8, 1989
[51] Int. Cl.5 .................................................. H04L 25/49
[52] U.S. Cl. ...................................... 375/60; 332/160; 330/149
[58] Field of Search ............................... 375/60, 67, 39; 455/116; 332/103, 159, 155, 160; 307/491, 498; 330/149

[56] References Cited

U.S. PATENT DOCUMENTS

| | | | |
|---|---|---|---|
| 2,705,775 | 4/1955 | Crosby | 332/160 |
| 3,900,823 | 8/1975 | Sokal et al. | 332/159 |
| 4,291,277 | 9/1981 | Davis et al. | 375/60 |
| 4,462,001 | 7/1984 | Girard | 375/60 |
| 4,700,151 | 10/1987 | Nagata | 375/39 |

Primary Examiner—Stephen Chin
Attorney, Agent, or Firm—Darby & Darby

[57] ABSTRACT

A control voltage generator in a transmitter arrangement for, e.g., QAM signals comprising a class C output amplifier (AMP). The control voltage generator (CVG) comprises a memory with a look up table (ROM), whereby the I,Q-signals (I,Q) of the modulating signal (DM) address a cell in the look-up table (ROM), the information of which is used as a control signal (CS) to control the amplifier output level (RF). The information is modified to compensate for temperature variations and other non-linearities.

6 Claims, 1 Drawing Sheet

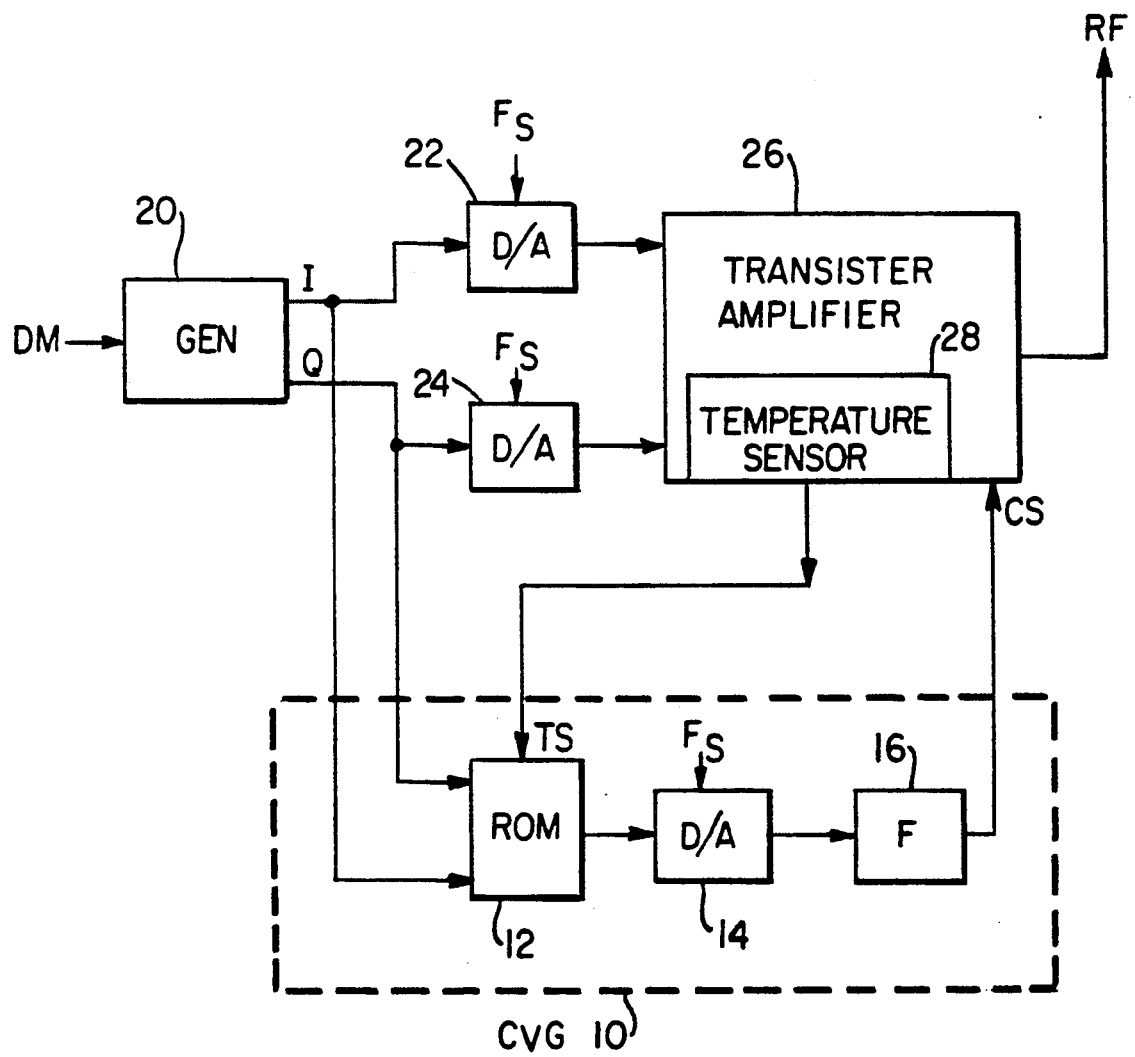

CONTROL VOLTAGE GENERATOR IN A TRANSMITTER ARRANGEMENT FOR DIGITALLY MODULATED SIGNALS

BACKGROUND OF THE INVENTION

1. Field of the invention

The invention relates to a control voltage generator in a transmitter arrangement for digitally modulated signals, and, more particularly, to a transmitter arrangement, whereby the modulation is a non-constant envelope modulation and the transmitter arrangement comprises a class C output amplifier.

2. Description of the prior art

In digital radio systems that do not use constant envelope modulation, the radio transmitter usually comprises a linear class A, AB or, in some instances linearized class C amplifiers. Such modulation schemes include, e.g., schemes of the QAM-type (Quadrature Amplitude Modulation), where the modulated information exists both in the signal phase and in the signal amplitude. A modulation scheme of this kind has been proposed for use in the future North-American digital mobile radiotelephone system.

Linear amplifiers have a poor efficiency compared to a nonlinear amplifier operating in class C mode. On the other hand, linearized class C amplifiers generally have complicated designs.

SUMMARY OF THE INVENTION

It is an object of the present invention to provide a transmitter arrangement with features that overcome the drawbacks of the prior art, and provides a kind of linearization, especially in such radio systems where the requirements on linearity are not too stringent. This is the case for a subscriber set in the above-mentioned digital mobile radiotelephone system. A not too stringent requirement on linearity means in this case an intermodulation distortion of the order -30 dB.

According to the invention, the transmitter arrangement is provided with a control voltage generator for digitally modulated signals, whereby the modulation is a non-constant envelope modulation and the transmitter arrangement comprises a class C output amplifier and a control voltage generator, wherein the output signal of the control voltage generator acts on the amplifier output envelope level or gain.

In digital modulation the modulating signal is used to create I,Q -waveforms (In-phase, Quadrature; i.e., two signals wherein one has the same phase as the modulating signal and the second is shifted by 90 degrees). The I,Q waveforms are multiplied with the sin and cos waveforms of a signal that has a frequency equalling, e.g., the transmission frequency. The resulting signal is a modulated signal, e.g., the radio frequency transmission signal.

Preferably the control voltage generator comprises a memory with a look-up table, whereby the I,Q-signals of the modulating signal are connected to the input of the look-up table to select a cell, the non-varying information of which is used to create a control voltage generator output signal in correspondence to the actual input signal.

The control voltage generator can be realized in several ways. The information initially stored in the cells of the look-up table is modified to compensate for the measured non-linearity of the control part of the amplifier. The control voltage generator can also be used to compensate for temperature dependent nonlinearities in the amplifier.

Advantageously the look-up table further has an input for a signal from a temperature sensor that senses the amplifier temperature. The sensor signal can be used to continuously modify the information in the cells or to select the correct cells into which the information has been stored in accordance with a temperature compensation algorithm.

BRIEF DESCRIPTION OF THE DRAWINGS

The invention is further described by way of example with reference to the accompanying drawing, in which the only figure is a block diagram showing the main parts of the inventive control voltage generator and the connections to the transmitter arrangement.

DETAILED DESCRIPTION OF THE PREFERRED EMBODIMENTS

The accompanying drawing shows the control voltage generator (CVG 10), comprising a digital look-up table (ROM 12), a digital to analog converter (D/A 14) and a filter (F 16).

The modulating signal DM (digital modulating signal input) is connected to the input of the I,Q-generator (GEN 20). The outputs I and Q of the generator GEN carry an in-phase signal I and a 90 degrees phase-shifted signal Q, respectively. In the main signal stream the signals I, Q are connected to the input of the digital to analog converters (D/A 22,24), which operate at the sampling frequency Fs. The sampling frequency Fs is, e.g., four times the bit rate (Fb) of the input binary signal DM. The analog output signals from the digital to analog converters (D/A 22,24) are connected to the inputs of the up-converter/amplifier (AMP 26), operating in class C. The radio frequency output signal RF from the amplifier (AMP 26) is connected to the antenna (not shown) of the transmitter arrangement.

The look-up table ROM 12 is a read-only memory comprising a quantity of cells. Control words corresponding to every amplitude value of the I,Q signals are stored in the cells. The I,Q signals are branched from the main signal stream and connected to the inputs of the look-up table ROM. The I,Q signals are used to select an individual cell, i.e. to address a cell with its control word. The control words are read at the same sampling frequency as the I,Q signals are sampled in the main signal stream (in the digital to analog converters D/A 22,24) and supplied to the input of the digital to analog converter D/A 14. The sampling frequency is, e.g., four times the bit rate of the input binary signal DM.

The analog signal corresponding to the control word from the digital to analog converter D/A 14 is filtered in the low-pass filter F 16 and then supplied as a control signal CS to the transmitter amplifier AMP 26. The control signal CS will act on the output envelope level of the amplifier AMP by controlling a characteristic such as the collector voltage.

The cut-off frequency (B) of the filter F is chosen to be equal or greater than the bit rate (Fb), thereby attenuating the harmonics of the sampling frequency. Moreover, the lowpass filter F reduces the quantizing noise to the required level, this noise resulting from the limited accuracy of the control words (e.g. with a resolution of 8 bits) stored in the look-up table ROM 12. The required noise level will vary in accordance with the individual system requirements, an also in accordance with the required linearity.

The operation of the look-up table ROM can be described by signal equations. In the following it is assumed, that the level of the output signal RF from the transmitter amplifier AMP 26 has a linear relation to the control signal CS, omitting any compensations. Between the input and output signals of the look-up table ROM we then have the interdependence:

$$CS(n \cdot Ts) = [I^2(n \cdot Ts) + Q^2(n \cdot Ts)]^{\frac{1}{2}}$$

where:
CS(n Ts) is the control signal at time instant n Ts;
I(n Ts) is the value of the I signal at the time instant T s;
Q(n Ts) is the value of the Q signal at the time instant n Ts;
n is an integer number corresponding to the number of the sampling point; and
Ts is the sampling interval corresponding to the frequency Fs; and W is the signal used to create the I,Q signals.

In the above case the control signal CS is given a value, according to the information stored in the look-up table ROM 12 selected by the respective I,Q signal, which is used to address the table.

The information in the look-up table cells can be modified to compensate for the non-linearities of the amplifier control part. The values to be put in the cells are then calculated according to the above equations and modified with results from actual measurements. This is the case for temperature compensation as well.

The temperature compensation of the amplifier requires a known temperature sensor connected to the amplifier AMP 26. The output of the sensor is connected to a third input of the look-up table ROM, which in this case includes a set of cells with information containing correction values. The sensor signal (TS) addresses a correction value, which is added to the cell values of the I,Q signals, in accordance with an algorithm stored in the memory (ROM 12). Another way is to have different sets of cells including control information for different temperature ranges.

The information contents of the look-up table ROM in the control voltage generator is preferably programmed (stored) during the final production tests of the transmitter arrangement equipment, when the individual variations in the amplifier characteristics, such as non-linearities and temperature dependency, can be accurately measured.

Applications of the principles of the invention in this and similar manners are all intended to fall within the scope of the invention.

What is claimed is:

1. A control voltage generator in a transmitter arrangement for digitally modulated signals, wherein the modulation is a non-constant envelope modulation and the transmitter arrangement comprises a class C output amplifier (AMP) and a control voltage generator (CVG), characterized in that the amplifier has an output level control, an input modulating signal (DM) for the transmitter is directed to the control voltage generator and defines a generator output signal (CS) of the control voltage generator (CVG), and the generator output signal is fed forward to the level control of the amplifier to control the linearity of the amplifier (AMP) output (RF) level, without a feedback signal from the output (RF) level signal of the amplifier.

2. A control voltage generator as claimed in claim 1, characterized in that a converter converts the input modulating signal to In phase, Quadrature I,Q signals, the generator comprises a memory with a look-up table (ROM), the I,Q signals of the modulating signal (DM) are connected to the input of the look-up table (ROM) to select a cell, each cell having information which is used to create the control voltage generator output signal (CS) in correspondence with the actual input signal (DM).

3. A control voltage generator as claimed in claim 2, where the amplifier (AMP) operates nonlinearly, characterized in that the information stored in the cells of the look-up table (ROM) is modified to compensate for the predetermined non-linearity of the amplifier (AMP) and the change in response of the amplifier due to signals at its level control.

4. A control voltage generator as claimed in claims 2 or 3, characterized in that the look-up table (ROM) further has an input for a signal from a temperature sensor, and the amplifier has a temperature sensor for sensing the amplifier temperature and producing a sensor signal related thereto, the sensor signal being used to continuously modify the information in the cells in accordance with a temperature compensation algorithm stored in the memory (ROM) to maintain linearity with temperature.

5. A control voltage generator as claimed in claims 2 or 3, characterized in that the look-up table (ROM) further has an input for a signal from a temperature sensor, and the amplifier has a temperature sensor for sensing the amplifier temperature and producing a sensor signal related thereto, the sensor signal being used to selected a correct set of cells including control information related to the respective temperature range in order to maintain linearity with temperature.

6. A control voltage generator as claimed in claim 1, where the amplifier is a transistor amplifier and the amplifier level control is connected to the collectors of transistors to vary the gain of the amplifier.

* * * * *